(12) United States Patent
Mai et al.

(10) Patent No.: US 10,295,572 B1
(45) Date of Patent: May 21, 2019

(54) VOLTAGE SAMPLING SWITCH

(71) Applicant: NXP USA, INC., Austin, TX (US)

(72) Inventors: Khoi Mai, Austin, TX (US); Michael Todd Berens, Austin, TX (US); Jon Scott Choy, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/951,414

(22) Filed: Apr. 12, 2018

(51) Int. Cl.
*H03K 5/00* (2006.01)
*G01R 15/16* (2006.01)
*G01R 19/00* (2006.01)
*H03K 17/08* (2006.01)
*H03K 5/24* (2006.01)

(52) U.S. Cl.
CPC ......... *G01R 15/16* (2013.01); *G01R 19/0084* (2013.01); *H03K 5/24* (2013.01); *H03K 17/08* (2013.01)

(58) Field of Classification Search
CPC ........... H01L 29/7869; H01L 29/78696; H01L 27/1225
See application file for complete search history.

(56) References Cited

U.S. PATENT DOCUMENTS

| | | |
|---|---|---|
| 5,084,634 A | 1/1992 | Gorecki |
| 7,183,814 B2 | 2/2007 | Kudo |
| 7,385,440 B2 | 6/2008 | Aksin et al. |
| 7,397,284 B1 | 7/2008 | Liu |
| 7,940,091 B1 | 5/2011 | Govindarajulu et al. |
| 8,664,979 B2 | 3/2014 | Doris et al. |
| 9,484,905 B1 | 11/2016 | Mai et al. |
| 2012/0313800 A1* | 12/2012 | Thomas ................... G11C 7/02 341/122 |

OTHER PUBLICATIONS

Dessouky, M., "Input switch configuration suitable for rail-to-rail operation of switched opamp circuits"; Electronics Letters, vol. 35, No. 1, Jan. 7, 1999.
Waltari, M., "A Self-Calibrated Pipeline ADC with 200MHz IF-Sampling Frontend"; ISSCC 2002 / Session 18/ Converter Techniques / 18.5; IEEE International Solid-State Circuits Conference 2002.

\* cited by examiner

*Primary Examiner* — Sibin Chen

(57) ABSTRACT

A voltage sampling circuit and method are provided. The voltage sampling circuit includes a capacitor having a first terminal and a second terminal. A first pre-charge circuit is coupled to a first voltage supply terminal and to the first terminal of the capacitor. The first pre-charge circuit is configured to receive a first control signal and pre-charge the capacitor to a first voltage. A switch circuit includes a first transistor having a first current electrode coupled to an input terminal of the voltage sampling circuit, a control electrode coupled to the first terminal of the capacitor, and a body electrode coupled to the second terminal of the capacitor. A second transistor having a first current electrode coupled to a second current electrode of the first transistor, a body electrode coupled to the second terminal of the capacitor, and a second current electrode coupled to an output terminal of the voltage sampling circuit.

20 Claims, 3 Drawing Sheets

VOLTAGE SAMPLING SWITCH

BACKGROUND

Field

This disclosure relates generally to circuits, and more specifically, to a voltage sampling switch circuit.

Related Art

Board level system developers are increasingly challenged as semiconductor process technology advances for modern integrated circuits (ICs). For example, a system may include multiple ICs assembled on a common printed circuit board (PCB). The multiple ICs are likely to be sourced from different manufacturers and processed in various process technologies. Operating voltages supplied to the multiple ICs are generally based on the process technology of each IC and reflected in the manufacturer's specifications. For example, one IC may require 5.0 volts to operate, while another IC may require 3.6 volts to operate, and so on. The system PCB design typically includes electrical traces which route appropriate supply voltages to each IC.

System manufacturers may qualify a particular PCB design having a corresponding set of ICs, and continue to use the PCB design and set of ICs for several years for a given product or family of products. Advances in process technology enable smaller transistor features which may in turn allow for one or more ICs in the set to realize cost reductions. However, smaller transistors usually require a lower operating voltage. For the system manufacturers to gain advantages by replacing an IC with a lower cost IC manufactured at a more advanced process technology, a new system PCB design could be required to route the appropriate lower voltage to the lower cost IC. Design changes to the PCB would likely require a requalification of the system, impacting production and incurring significant costs. As such, there is a need for ICs to be processed in an advanced technology without impacting the supply voltage requirements of the ICs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an input voltage sampling switch which samples input voltages significantly higher than the operating supply voltage of the switch while protecting transistors of the switch from receiving voltages beyond an oxide voltage rating of the transistors. The sampling switch circuitry provides a constant, input voltage-independent on-resistance minimizing harmonic distortion and allowing for higher resolution operations.

Figure 1:
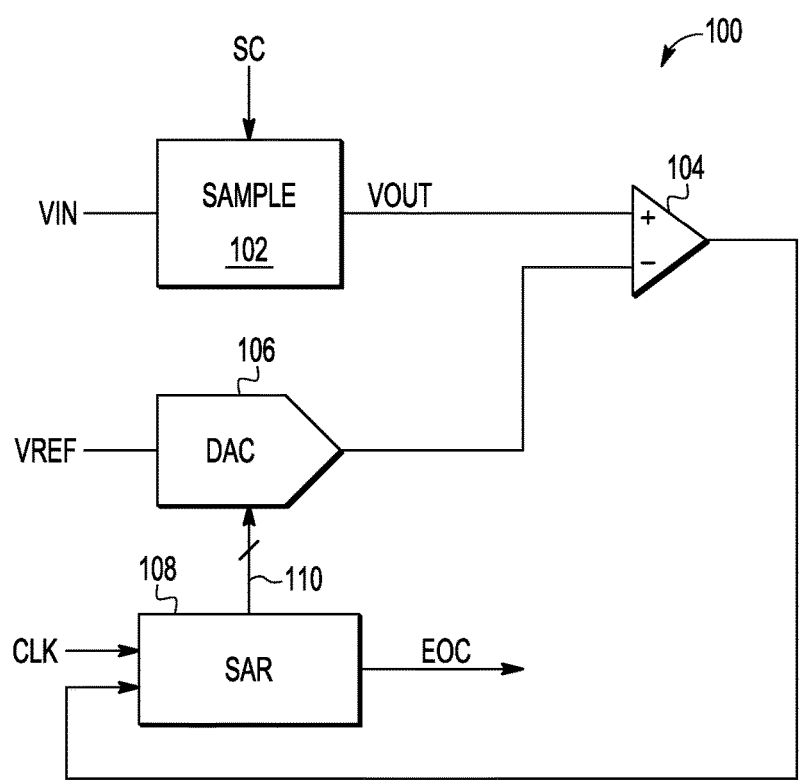
FIG. 1 illustrates, in simplified block diagram form, an exemplary analog-to-digital converter (ADC) in accordance with an embodiment of the present disclosure.

FIG. 1 illustrates, in simplified block diagram form, an exemplary analog-to-digital converter (ADC) 100 in accordance with an embodiment of the present disclosure. ADC 100 may be formed as an integrated circuit implemented using a CMOS process. In some embodiments, ADC 100 may be integrated in a system-on-a-chip (SoC). ADC 100 includes input voltage sampling switch circuit 102, voltage comparator 104, digital-to-analog converter (DAC) 106, and successive approximation register (SAR) 108. In this embodiment, ADC 100 is configured to receive an input voltage signal VIN at an input labeled VIN, a reference voltage VREF at an input labeled VREF, a clock signal CLK at an input labeled CLK, a control signal SC at an input labeled SC, and provide an end of conversion signal EOC at an output labeled EOC. In the embodiment of FIG. 1, switch circuit 102 is shown coupled to circuitry of an SAR ADC. In other embodiments, switch circuit 102 may be coupled to circuitry of other ADC types such as flash ADCs, sigma-delta ADCs, and others. In yet other embodiments, switch circuit 102 may be used in data converters, analog devices, sensors, and other processing devices.

In the exemplary ADC 100 depicted in FIG. 1, switch circuit 102 receives input voltage signal VIN and, based on the SC control signal, provides an output voltage signal VOUT at output labeled VOUT. In some embodiments, switch circuit 102 may be characterized as a sample-and-hold circuit. For example, when the SC control signal is at a first logic level (e.g., a logic high), switch circuit 102 samples the input voltage signal VIN and couples the sampled voltage to the output VOUT. When the SC control signal is at a second logic level (e.g., a logic low), the VIN input is isolated from the output VOUT, allowing the sampled voltage at output VOUT to be sustained or held by way of capacitance coupled to the VOUT output. The VIN voltage may exceed a voltage rating for at least some transistors in switch circuit 102.

Comparator 104 is coupled to receive the VOUT signal at a first input and an output signal from the DAC 106 at a second input. The DAC output signal may be characterized as a voltage signal corresponding to a digital code provided to the DAC 106 by way of a plurality of signal lines 110. An output of comparator 104 is coupled to an input of SAR 108. Comparator 104 provides at the output a signal indicating a difference between the sampled voltage provided at output VOUT and the output voltage from the DAC 104.

During iterations of an analog-to-digital conversion, the SAR 108 receives the difference signal from comparator 104 and provides, at an output, the digital code based on the received signal. The DAC 106 receives the digital code from the SAR 108 at a first input, and the reference voltage VREF at a second input. In turn, the DAC 106 provides a voltage based, at least in part, on the digital code. At the end of the analog-to-digital conversion, the digital end of conversion signal EOC provided at the output EOC of SAR 108 is asserted.

Figure 2:
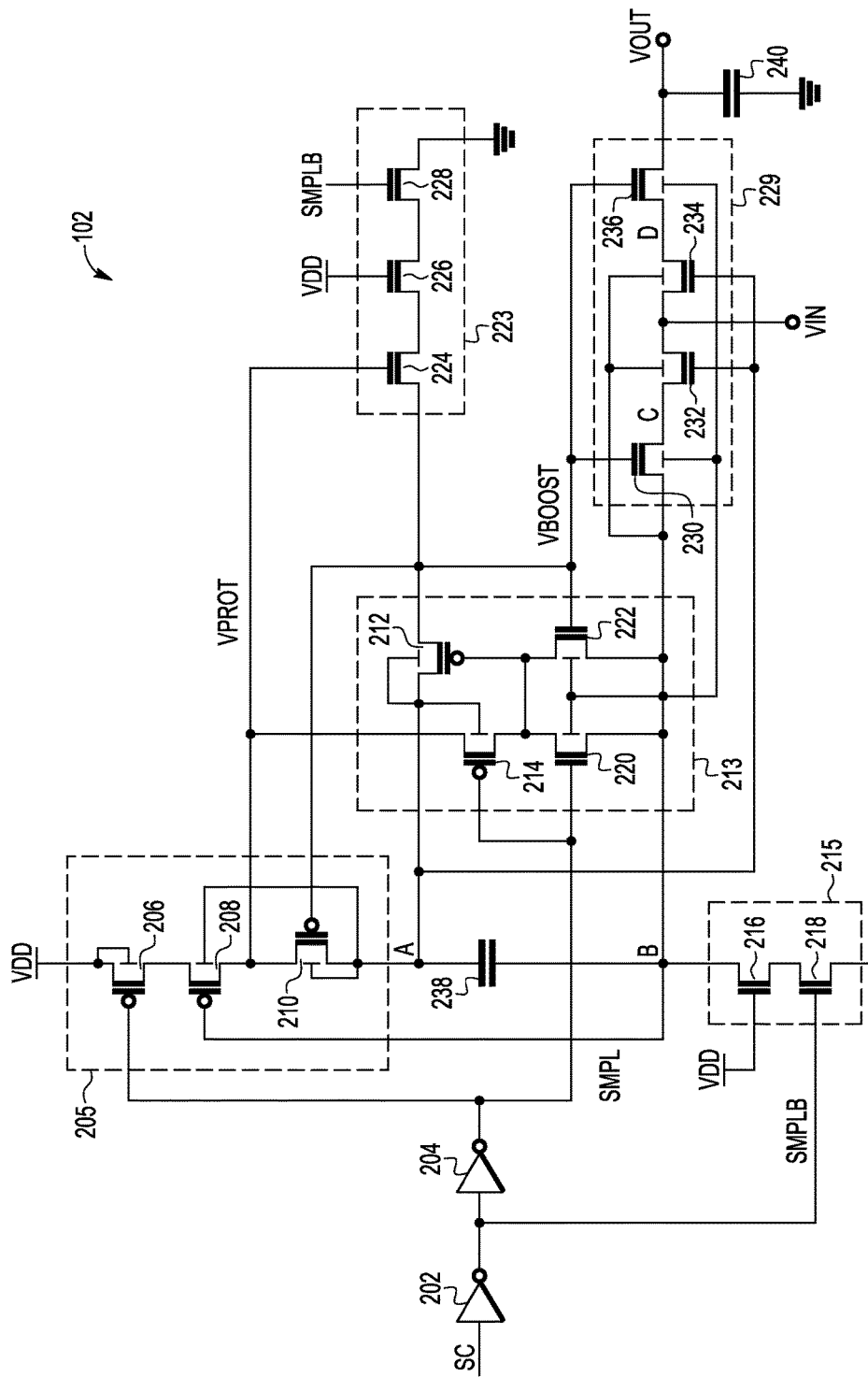
FIG. 2 illustrates, in schematic diagram form, an input voltage sampling switch circuit in accordance with an embodiment of the present disclosure.

FIG. 2 illustrates, in schematic diagram form, an input voltage sampling switch circuit 102 in accordance with an embodiment of the present disclosure. Switch circuit 102 is configured to receive the switch control signal SC at a first input and receives the input voltage signal VIN at the input terminal labeled VIN. The VIN voltage may exceed a voltage rating for at least some transistors in switch circuit 102. Based on the SC signal and the VIN signal, switch circuit 102 provides the output voltage signal VOUT at output terminal labeled VOUT. Switch circuit 102 includes a first pre-charge circuit 205, a second pre-charge circuit 215, output disable circuitry 223, output switch circuitry 229, boost transfer circuitry 213, a boost capacitor 238, a load capacitor 240, SC control signal inverters 202 and 204, a first supply voltage terminal labeled VDD, and a second voltage supply terminal (ground).

The SC control signal generally toggles between ground and VDD voltages. The VDD voltage may be a voltage similar to the voltage provided to digital circuitry in the ADC 100, for example, 1.8V. Inverter 202 receives the SC control signal at an input and generates a complement signal SMPLB at an output connected to node labeled SMPLB. Inverter 204 receives the SMPLB signal at an input and generates a buffered or true version of the switch control signal (SC) at an output connected to node labeled SMPL. The SMPL and SMPLB signals are provided to circuitry within the switch circuit 102. In some embodiments, the SC signal may be a periodic signal such as a clock signal.

The first pre-charge circuit 205 includes P-channel transistors 206-210 connected in series between the first supply voltage and a first terminal or top plate of boost capacitor 238. Capacitor 238 may be formed with any suitable materials and structures available in a given process technology such as metal-oxide-semiconductor (MOS) capacitors, metal-oxide-metal (MOM) capacitors, metal-insulator-metal (MIM) capacitors, polysilicon-insulator-polysilicon (PIP) capacitors, deep trench capacitors, and the like, for example. The P-channel transistors 206-210 are configured to form a first set of cascoded transistors. In the first set, a first current electrode or source electrode of transistor 206 is connected to the first supply voltage VDD, a second current electrode of transistor 206 is connected to a first current electrode of transistor 208, a control electrode of transistor 206 is coupled to receive the SMPL signal at the output of inverter 204, and a body terminal of transistor 206 is connected to the VDD voltage supply. A second current electrode of transistor 208 is connected to a first current electrode of transistor 210, a first current electrode of transistor 214 and a control electrode of transistor 224 at node VPROT. The voltage generated at node VPROT protects transistors 214 and 224 from receiving a voltage beyond an oxide voltage rating of the transistors. A second current electrode or drain electrode of transistor 210 is connected to the top plate of capacitor 238, to a first current electrode of transistor 212, to a control electrode of transistor 232, and to a control electrode of transistor 234 at node A. Body terminals of P-channel transistors 208-214 are connected to each other at node A such that the body voltage of each of transistors 208-214 corresponds to the voltage at node A.

The second pre-charge circuit 215 includes N-channel transistors 216 and 218 connected in series between the second supply voltage and a second terminal or bottom plate of boost capacitor 238. The N-channel transistors 216-218 are configured to form a second set of cascoded transistors. In the second set, a first current electrode of transistor 216 is connected to the bottom plate of capacitor 238, a control electrode of transistor 208, a first current electrode of transistor 220, a first current electrode of transistor 222, and a first current electrode of transistor 230, at node labeled B. A second current electrode of transistor 216 is connected to a first current electrode of transistor 218. A control electrode of transistor 216 is connected to the first supply voltage VDD and a second current electrode of transistor 218 is connected to the second supply voltage shown as ground. A control electrode of transistor 218 is coupled to receive the SMPLB signal.

The boost transfer circuitry 213 includes P-channel transistors 212 and 214 and N-channel transistors 220 and 222. A second current electrode of transistor 212 is connected to a control electrode of transistor 222, a control electrode of transistor 210, a control electrode of transistor 230, a control electrode of transistor 236, and a first current electrode or drain electrode of transistor 224 at node labeled VBOOST. A control electrode of transistor 212 is connected to a second current electrode of transistor 214, a second current electrode of transistor 220, and a second current electrode of transistor 222. A control electrode of transistor 214 and a control electrode of transistor 220 are each coupled to receive the SMPL signal at the output of inverter 204. In this embodiment, body electrodes of transistors 220-222 are each connected to node B.

The output disable circuitry 223 includes N-channel transistors 224-228 connected in series between the second supply voltage and the VBOOST node. The N-channel transistors 224-228 are configured to form a third set of cascoded transistors. In the third set, a second current electrode of transistor 224 is connected to a first current electrode of transistor 226, and a second current electrode of transistor 226 is connected to a first current electrode of transistor 228. A second current electrode or source electrode of transistor 228 is connected to the second supply voltage. The control electrode of transistor 226 is connected to the first supply voltage, and the control electrode of transistor 228 is coupled to receive the SMPLB signal.

The output switch circuitry 229 includes N-channel transistors 230-236 connected in series between the VOUT terminal and node B. The N-channel transistors 230-236 are configured to form a fourth set of cascoded transistors. In the fourth set, a second current electrode of transistor 230 is connected to a first current electrode of transistor 232, and a second current electrode of transistor 232 is connected to a first current electrode of transistor 234. A second current electrode of transistor 234 is connected to a first current electrode of transistor 236, and a second current electrode of transistor 236 is connected to the VOUT terminal. In this embodiment, body electrodes of transistors 230-236 are each connected to node B. The control electrodes of transistors 230 and 236 are each connected to node VBOOST, and the control electrodes of transistors 233 and 234 are each connected to node A. Load capacitor 240 is connected to VOUT terminal. Load capacitor 240 may include intrinsic capacitance of circuitry connected to the VOUT terminal. Load capacitor 240 may be any combination of intrinsic capacitance of circuitry, parasitic capacitance, and capacitive elements such MOS capacitors, MOM capacitors, MIM capacitors, PIP capacitors, and the like connected to the VOUT terminal.

Operation of the switch circuit 102 is described further by way of example. In this example, the SC signal is characterized as a digital signal that toggles between a logic low level (e.g., ground) and a logic high level (e.g., VDD), and may have a periodic waveform much like a clock signal, for example. When the SC signal is at a logic high, the switch circuit 102 is characterized as being in a sample phase of operation. When the SC signal is at a logic low, the switch circuit 102 is characterized as being in a pre-charge phase of operation.

When the SC signal is de-asserted as a logic low, the switch circuit 102 enters the pre-charge phase of operation. During the pre-charge phase, the transistors of the first pre-charge circuit 205 and the transistors of the second pre-charge circuit 215 are turned on, pre-charging boost capacitor 238 to an initial voltage. In this example, VIN is an analog voltage signal that may vary between two times VDD (VDD*2) and ground (e.g., 0 volts) voltages. For example, switch circuit 102 may be formed in a process technology having VDD=1.8 volts. Accordingly, VIN may vary between 3.6 volts and 0 volts. The output switch circuitry 229 is configured in an off state, isolating VIN from VOUT. While the output switch circuitry 229 is configured in the off state, the voltage at VOUT corresponds to a sampled voltage stored on load capacitor 240. Internal node VPROT is pre-charged to a voltage approximately equal to VDD and internal node VBOOST is pre-charged to a voltage approximately equal to 0 volts or ground.

When the SC signal is asserted as a logic high, the switch circuit 102 enters the sample phase of operation. During the sample phase, a transistor in each of the first pre-charge circuit 205, the second pre-charge circuit 215, and the disable circuitry 223 is turned off, isolating the circuits 205, 215, and 223 from the first supply voltage (e.g., VDD) and from the second supply voltage (ground) respectively. A voltage stored on boost capacitor 238 is coupled to the VPROT and VBOOST nodes accordingly. In this example, VPROT is an analog voltage signal at the internal node labeled VPROT and based on the VIN voltage signal, may vary between approximately two times VDD and VDD voltages. VBOOST is an analog voltage signal at the internal node labeled VBOOST and based on the VIN voltage signal, may vary between approximately three times VDD (VDD*3) and ground voltages. For example, switch circuit 102 may be formed in a process technology having VDD=1.8 volts. Accordingly, VBOOST may vary between 5.4 volts and 0 volts.

Because transistors 230-236 of the output switch circuitry 229 are in the on state during the sample phase, a voltage VIN at the VIN input is sampled and provided at the output labeled VOUT. While in the sample phase, the VPROT, VBOOST, and node B voltages track with changes in the VIN voltage, providing corresponding transistor voltages within allowable voltage tolerances specified for a given process technology. With the body terminals of transistor 230-236 connected to node B, constant gate-to-source voltage and constant bulk-to-source voltage can be maintained. Accordingly, a significantly more linear resistance is realized from VIN to VOUT.

Figure 3:
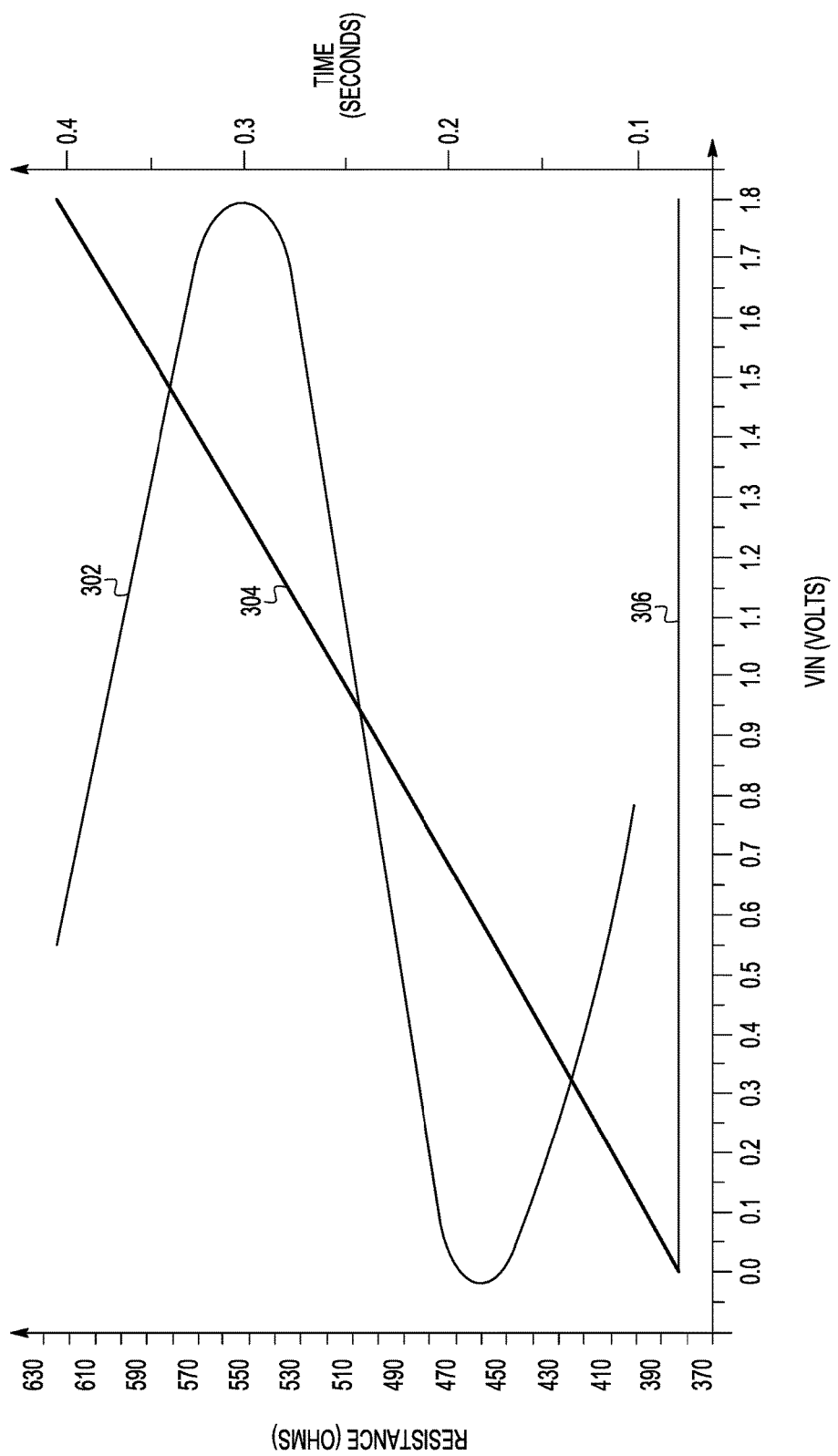
FIG. 3 illustrates, in a graphical view, an equivalent on-resistance versus input voltage plot of the switch circuit of FIG. 2 in accordance with an embodiment of the present disclosure.

FIG. 3 illustrates, in a graphical view, an equivalent on-resistance versus input voltage plot of the switch circuit 102 in accordance with an embodiment of the present disclosure. Input voltage values (VIN) are shown in volts on the X-axis, switch circuit on-resistance values are shown in ohms on the left Y-axis, and time values associated with the input voltage values are shown in seconds on the right Y-axis. FIG. 3 includes a first plot 302 depicting a simulation input stimulus of varying input voltage values (e.g., 0 to 1.8 volts) with time, a second plot 304 depicting simulation results of a switch circuit having on-resistance dependent upon VIN, and a third plot 306 depicting simulation results of switch circuit 102 having on-resistance independent of VIN. Here, the second plot 304 shows on-resistance values varying with input voltage VIN. For example, with VIN at approximately 0.2 volts, the on-resistance value shown in second plot 304 is approximately 400 ohms, and with VIN at approximately 1.6 volts, the on-resistance value shown in second plot 304 is approximately 600 ohms. On the other hand, third plot 306 shows on-resistance values remaining constant with input voltage VIN. For example, the on-resistance value shown in third plot 306 is approximately 385 ohms over a range of VIN values (e.g., 0 to 1.8 volts). Because on-resistance of switch circuit 102 remains constant over an operating range of VIN voltages, harmonic distortion can be minimized and higher resolution operations can be performed.

Generally, there is provided, a voltage sampling circuit, including a first capacitor having a first terminal and a second terminal; a first pre-charge circuit coupled to a first voltage supply terminal and to the first terminal of the first capacitor, the first pre-charge circuit configured to receive a first control signal and pre-charge the first capacitor to a first voltage; a switch circuit including: a first transistor having a first current electrode coupled to an input terminal of the voltage sampling circuit, a control electrode coupled to the first terminal of the first capacitor, and a body electrode coupled to the second terminal of the first capacitor; and a second transistor having a first current electrode coupled to a second current electrode of the first transistor, a body electrode coupled to the second terminal of the first capacitor, and a second current electrode couple to an output terminal of the voltage sampling circuit. The circuit may further include a second pre-charge circuit coupled to a second voltage supply terminal and to the second terminal of the first capacitor, the second pre-charge circuit configured to receive a second control signal and pre-charge the first capacitor to a first voltage, the second control signal a complement signal of the first control signal. The switch circuit may be configured to receive an input voltage signal at the input terminal, the input voltage signal having a voltage range including a voltage higher than a voltage rating of gate oxide for transistors in the switch circuit. The circuit may further include a second capacitor having a first terminal coupled to the output terminal and a second terminal coupled to a second voltage supply terminal. The output terminal may be coupled to an input terminal of a voltage comparator. The circuit may further include a boost select circuit coupled to the first capacitor and coupled to the switch circuit, the boost select circuit including: a third transistor having a first current electrode coupled to the first terminal of the first capacitor and a second current electrode coupled to a control electrode of the second transistor at a boost node; and a fourth transistor having a first current electrode coupled to a control electrode of the third transistor, a control electrode coupled to the boost node, a second current electrode coupled to the second terminal of the first capacitor, and a body electrode coupled to the second terminal of the first capacitor. The switch circuit may further include a fifth transistor having a first current electrode coupled to the second terminal of the first capacitor, a control electrode coupled to the boost node, and a body electrode coupled to the second terminal of the first capacitor; and a sixth transistor having a first current electrode coupled to a second current electrode of the fifth transistor, a control electrode coupled to the second terminal of the first capacitor, a second current electrode coupled to the input terminal of the voltage sampling circuit, and a body electrode coupled to the second terminal of the first capacitor. The first pre-charge circuit may include: a fifth transistor having a first current electrode coupled to the first voltage supply terminal, and a control electrode coupled to receive a first control signal; a sixth transistor having a first current electrode coupled to a second current electrode of the fifth transistor, and a control electrode coupled to the second terminal of the first capacitor; and a seventh transistor having a first current electrode coupled to a second current electrode of the sixth transistor, a control electrode coupled to the boost node, and a second current electrode coupled to the first terminal of the first capacitor. The circuit may further include an output disable circuit coupled to the boost node, the output disable circuit including: a fifth transistor having a first current electrode coupled to the boost node; a sixth transistor having a first current electrode coupled to a second current electrode of the fifth transistor; and a seventh transistor having a first current electrode coupled to a second current electrode of the sixth transistor, and a second current electrode coupled to a second voltage supply terminal.

In another embodiment, there is provided, a voltage sampling circuit, including: a first capacitor having a first terminal and a second terminal; a first pre-charge circuit coupled to a first voltage supply terminal and to the first terminal of the first capacitor, the first pre-charge circuit configured to receive a first control signal and pre-charge the first capacitor to a first voltage; a boost select circuit having a first input coupled to the first terminal of the first capacitor and an output coupled to a boost node; a switch circuit including: a first transistor having a first current electrode coupled to an input terminal of the voltage sampling circuit, a control electrode coupled to the first terminal of the first capacitor, and a body electrode coupled to the second terminal of the first capacitor; and a second transistor having a first current electrode coupled to a second current electrode of the first transistor, a body electrode coupled to the second terminal of the first capacitor, and a second current electrode coupled to an output terminal of the voltage sampling circuit. The switch circuit may further include: a third transistor having a first current electrode coupled to the second terminal of the first capacitor, a control electrode coupled to the boost node, and a body electrode coupled to the second terminal of the first capacitor; and a fourth transistor having a first current electrode coupled to a second current electrode of the fifth transistor, a control electrode coupled to the second terminal of the first capacitor, a second current electrode coupled to the input terminal of the voltage sampling circuit, and a body electrode coupled to the second terminal of the first capacitor. The circuit may further include a second pre-charge circuit coupled to a second voltage supply terminal and to the second terminal of the first capacitor, the second pre-charge circuit configured to receive a second control signal and pre-charge the first capacitor to the first voltage. The circuit may further include an output disable circuit coupled to the boost node, the output disable circuit includes: a third transistor having a first current electrode coupled to the boost node; a fourth transistor having a first current electrode coupled to a second current electrode of the third transistor; and a fifth transistor having a first current electrode coupled to a second current electrode of the fourth transistor, and a second current electrode coupled to a second voltage supply terminal. The boost select circuit includes: a third transistor having a first current electrode coupled to the first terminal of the first capacitor and a second current electrode coupled to a control electrode of the second transistor at the boost node; and a fourth transistor having a first current electrode coupled to a control electrode of the third transistor, a control electrode coupled to the boost node, a second current electrode coupled to the second terminal of the first capacitor, and a body electrode coupled to the second terminal of the first capacitor. The circuit may further include a second capacitor having a first terminal coupled to the output terminal of the voltage sampling circuit and a second terminal coupled to a second voltage supply terminal. The output terminal of the voltage sampling circuit may be coupled to a first input of a voltage comparator. The first voltage may be higher than a voltage applied at the first voltage supply terminal.

In yet another embodiment, there is provided, a method including: providing an input voltage signal to an input terminal of a voltage sampling circuit, the input voltage signal having a voltage range including a voltage higher than a voltage rating of gate oxide for transistors in the voltage sampling circuit; transferring a sampled voltage to an output terminal of the voltage sampling circuit by way of a switch circuit coupled between the input terminal and the output terminal, the switch circuit comprising: a first transistor having a first current electrode coupled to the input terminal, a control electrode coupled to a first terminal of a first capacitor, and a body electrode coupled to a second terminal of the first capacitor; and a second transistor having a first current electrode coupled to a second current electrode of the first transistor, a control electrode coupled to a boost node, a second current electrode coupled to the output terminal, and a body electrode coupled to the second terminal of the first capacitor; and coupling a boosted voltage at the first terminal of a first capacitor to the boost node by way of a boost select circuit, the boosted voltage higher than the sampled voltage, the boost select circuit including: a third transistor having a first current electrode coupled to the first terminal of the first capacitor and a second current electrode coupled to a control electrode of the second transistor at the boost node; and a fourth transistor having a first current electrode coupled to a control electrode of the third transistor, a control electrode coupled to the boost node, a second current electrode coupled to the second terminal of the first capacitor, and a body electrode coupled to the second terminal of the first capacitor. Transferring the sampled voltage to the output terminal by way of the switch circuit may occur during a first phase of a control signal, and the switch circuit may be disabled during a second phase of the control signal. The method may further include pre-charging the first capacitor to a supply voltage within the voltage rating of the gate oxide during the second phase of the control signal.

By now it should be appreciated that there has been provided, an input voltage sampling switch which samples input voltages significantly higher than the operating supply voltage of the switch while protecting transistors of the switch from receiving voltages beyond an oxide voltage rating of the transistors. The sampling switch circuitry provides a constant, input voltage-independent on-resistance minimizing harmonic distortion and allowing for higher resolution operations.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A voltage sampling circuit, comprising:
   a first capacitor having a first terminal and a second terminal;
   a first pre-charge circuit coupled to a first voltage supply terminal and to the first terminal of the first capacitor, the first pre-charge circuit configured to receive a first control signal and pre-charge the first capacitor to a first voltage;
   a switch circuit comprising:
      a first transistor having a first current electrode coupled to an input terminal of the voltage sampling circuit, a control electrode coupled to the first terminal of the first capacitor, and a body electrode coupled to the second terminal of the first capacitor; and
      a second transistor having a first current electrode coupled to a second current electrode of the first transistor, a body electrode coupled to the second terminal of the first capacitor, and a second current electrode couple to an output terminal of the voltage sampling circuit.

2. The circuit of claim 1, further comprising a second pre-charge circuit coupled to a second voltage supply terminal and to the second terminal of the first capacitor, the second pre-charge circuit configured to receive a second control signal and pre-charge the first capacitor to a second voltage, the second control signal a complement signal of the first control signal.

3. The circuit of claim 1, wherein the switch circuit is configured to receive an input voltage signal at the input terminal, the input voltage signal having a voltage range including a voltage higher than a voltage rating of gate oxide for transistors in the switch circuit.

4. The circuit of claim 1, further comprising a second capacitor having a first terminal coupled to the output terminal and a second terminal coupled to a second voltage supply terminal.

5. The circuit of claim 1, wherein the output terminal is coupled to an input terminal of a voltage comparator.

6. The circuit of claim 1, further comprising a boost select circuit coupled to the first capacitor and coupled to the switch circuit, the boost select circuit comprising:
   a third transistor having a first current electrode coupled to the first terminal of the first capacitor and a second current electrode coupled to a control electrode of the second transistor at a boost node; and
   a fourth transistor having a first current electrode coupled to a control electrode of the third transistor, a control electrode coupled to the boost node, a second current electrode coupled to the second terminal of the first capacitor, and a body electrode coupled to the second terminal of the first capacitor.

7. The circuit of claim 6, wherein the switch circuit further comprises:
   a fifth transistor having a first current electrode coupled to the second terminal of the first capacitor, a control electrode coupled to the boost node, and a body electrode coupled to the second terminal of the first capacitor; and
   a sixth transistor having a first current electrode coupled to a second current electrode of the fifth transistor, a control electrode coupled to the first terminal of the first capacitor, a second current electrode coupled to the input terminal of the voltage sampling circuit, and a body electrode coupled to the second terminal of the first capacitor.

8. The circuit of claim 6, wherein the first pre-charge circuit comprises:
   a fifth transistor having a first current electrode coupled to the first voltage supply terminal, and a control electrode coupled to receive a first control signal;
   a sixth transistor having a first current electrode coupled to a second current electrode of the fifth transistor, and a control electrode coupled to the second terminal of the first capacitor; and
   a seventh transistor having a first current electrode coupled to a second current electrode of the sixth transistor, a control electrode coupled to the boost node, and a second current electrode coupled to the first terminal of the first capacitor.

9. The circuit of claim 6, further comprising an output disable circuit coupled to the boost node, the output disable circuit comprises:
- a fifth transistor having a first current electrode coupled to the boost node;
- a sixth transistor having a first current electrode coupled to a second current electrode of the fifth transistor; and
- a seventh transistor having a first current electrode coupled to a second current electrode of the sixth transistor, and a second current electrode coupled to a second voltage supply terminal.

10. A voltage sampling circuit, comprising:
- a first capacitor having a first terminal and a second terminal;
- a first pre-charge circuit coupled to a first voltage supply terminal and to the first terminal of the first capacitor, the first pre-charge circuit configured to receive a first control signal and pre-charge the first capacitor to a first voltage;
- a boost select circuit having a first input coupled to the first terminal of the first capacitor and an output coupled to a boost node;
- a switch circuit comprising:
  - a first transistor having a first current electrode coupled to an input terminal of the voltage sampling circuit, a control electrode coupled to the first terminal of the first capacitor, and a body electrode coupled to the second terminal of the first capacitor; and
  - a second transistor having a first current electrode coupled to a second current electrode of the first transistor, a body electrode coupled to the second terminal of the first capacitor, and a second current electrode coupled to an output terminal of the voltage sampling circuit.

11. The circuit of claim 10, wherein the switch circuit further comprises:
- a third transistor having a first current electrode coupled to the second terminal of the first capacitor, a control electrode coupled to the boost node, and a body electrode coupled to the second terminal of the first capacitor; and
- a fourth transistor having a first current electrode coupled to a second current electrode of the fifth transistor, a control electrode coupled to the first terminal of the first capacitor, a second current electrode coupled to the input terminal of the voltage sampling circuit, and a body electrode coupled to the second terminal of the first capacitor.

12. The circuit of claim 10, further comprising a second pre-charge circuit coupled to a second voltage supply terminal and to the second terminal of the first capacitor, the second pre-charge circuit configured to receive a second control signal and pre-charge the first capacitor to a second voltage.

13. The circuit of claim 10, further comprising an output disable circuit coupled to the boost node, the output disable circuit comprises:
- a third transistor having a first current electrode coupled to the boost node;
- a fourth transistor having a first current electrode coupled to a second current electrode of the third transistor; and
- a fifth transistor having a first current electrode coupled to a second current electrode of the fourth transistor, and a second current electrode coupled to a second voltage supply terminal.

14. The circuit of claim 10, wherein the boost select circuit comprises:
- a third transistor having a first current electrode coupled to the first terminal of the first capacitor and a second current electrode coupled to a control electrode of the second transistor at the boost node; and
- a fourth transistor having a first current electrode coupled to a control electrode of the third transistor, a control electrode coupled to the boost node, a second current electrode coupled to the second terminal of the first capacitor, and a body electrode coupled to the second terminal of the first capacitor.

15. The circuit of claim 10, further comprising a second capacitor having a first terminal coupled to the output terminal of the voltage sampling circuit and a second terminal coupled to a second voltage supply terminal.

16. The circuit of claim 10, wherein the output terminal of the voltage sampling circuit is coupled to a first input of a voltage comparator.

17. The circuit of claim 10, wherein the first voltage is higher than a voltage applied at the first voltage supply terminal.

18. A method comprising:
- providing an input voltage signal to an input terminal of a voltage sampling circuit, the input voltage signal having a voltage range including a voltage higher than a voltage rating of gate oxide for transistors in the voltage sampling circuit;
- transferring a sampled voltage to an output terminal of the voltage sampling circuit by way of a switch circuit coupled between the input terminal and the output terminal, the switch circuit comprising:
  - a first transistor having a first current electrode coupled to the input terminal, a control electrode coupled to a first terminal of a first capacitor, and a body electrode coupled to a second terminal of the first capacitor; and
  - a second transistor having a first current electrode coupled to a second current electrode of the first transistor, a control electrode coupled to a boost node, a second current electrode coupled to the output terminal, and a body electrode coupled to the second terminal of the first capacitor; and
- coupling a boosted voltage at the first terminal of a first capacitor to the boost node by way of a boost select circuit, the boosted voltage higher than the sampled voltage, the boost select circuit comprising:
  - a third transistor having a first current electrode coupled to the first terminal of the first capacitor and a second current electrode coupled to a control electrode of the second transistor at the boost node; and
  - a fourth transistor having a first current electrode coupled to a control electrode of the third transistor, a control electrode coupled to the boost node, a second current electrode coupled to the second terminal of the first capacitor, and a body electrode coupled to the second terminal of the first capacitor.

19. The method of claim 18, wherein transferring the sampled voltage to the output terminal by way of the switch circuit occurs during a first phase of a control signal, and wherein the switch circuit is disabled during a second phase of the control signal.

20. The method of claim 19, further comprising pre-charging the first capacitor to a supply voltage within the voltage rating of the gate oxide during the second phase of the control signal.

* * * * *